(12) United States Patent
Whittaker

(10) Patent No.: US 6,295,563 B1
(45) Date of Patent: Sep. 25, 2001

(54) CONTROL SYSTEM FOR RECREATING OF DATA OUTPUT CLOCK FREQUENCY WHICH MATCHES DATA INPUT CLOCK FREQUENCY DURING DATA TRANSFERRING

(75) Inventor: Bruce Ernest Whittaker, Mission Viejo, CA (US)

(73) Assignee: Unisys Corporation, Blue Bell, PA (US)

( * ) Notice: Subject to any disclaimer, the term of this patent is extended or adjusted under 35 U.S.C. 154(b) by 0 days.

(21) Appl. No.: 09/016,749

(22) Filed: Jan. 30, 1998

(51) Int. Cl.⁷ .............................. G06F 3/00; G06F 3/02; G06F 13/12; G06F 13/38
(52) U.S. Cl. .................................................. 710/52; 710/65
(58) Field of Search .................. 710/29, 58, 60, 710/69, 52, 53, 57; 375/375, 376

(56) References Cited

U.S. PATENT DOCUMENTS

| | | | |
|---|---|---|---|
| 4,896,337 | * | 1/1990 | Bushy, Jr. .............................. 375/371 |
| 5,038,120 | * | 8/1991 | Wheatley et al. .................... 332/128 |
| 5,517,678 | * | 5/1996 | Klank et al. ....................... 455/182.2 |
| 5,918,073 | * | 6/1999 | Hewitt .................................... 377/47 |
| 6,044,124 | * | 3/2000 | Monahan et al. .................... 375/376 |
| 6,058,109 | * | 5/2000 | Lechleider ............................ 370/352 |

FOREIGN PATENT DOCUMENTS

| | | | | |
|---|---|---|---|---|
| 406112874A | * | 4/1994 | (JP) ..................................... 455/12.1 |
| 97/17777 | * | 5/1997 | (WO) . |

\* cited by examiner

*Primary Examiner*—Thomas Lee
*Assistant Examiner*—Chun Cao
(74) *Attorney, Agent, or Firm*—Alfred W. Kozak; Mark T. Starr; Lise A. Rode

(57) ABSTRACT

A digital data transport system where a serial stream of digital input data, received from a remote transmitter at an original clock frequency $F_o$, enters a FIFO repository at a variable frequency bit rate having an average frequency rate of $I_f$. A difference generator G, operating at the $I_f$ frequency rate, receives a first feedback frequency clock signal $F_r$ from a voltage controlled oscillator and a second feedback signal designating the current loading of the FIFO to provide a variable pulse stream to a driver whose output voltage controls the voltage controlled oscillator output frequency $F_r$ so that it will match the average input frequency bit rate $I_f$ (less the header bytes) in order to approximate the original clock frequency $F_o$.

8 Claims, 7 Drawing Sheets

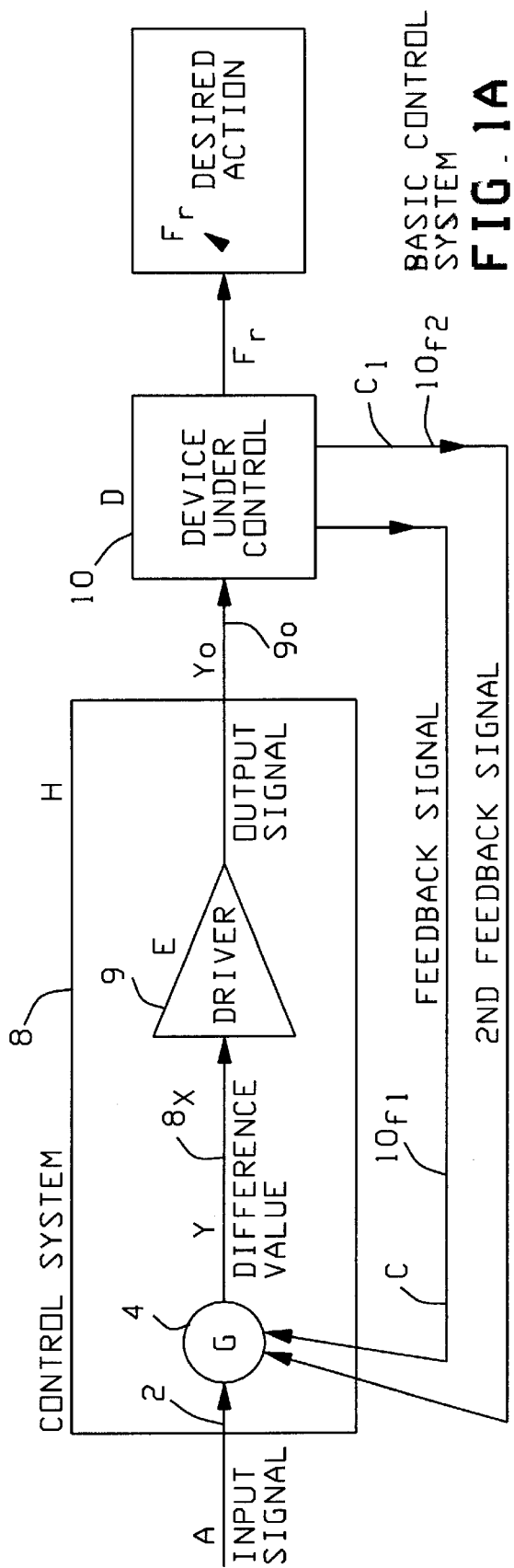
FIG. 1A BASIC CONTROL SYSTEM
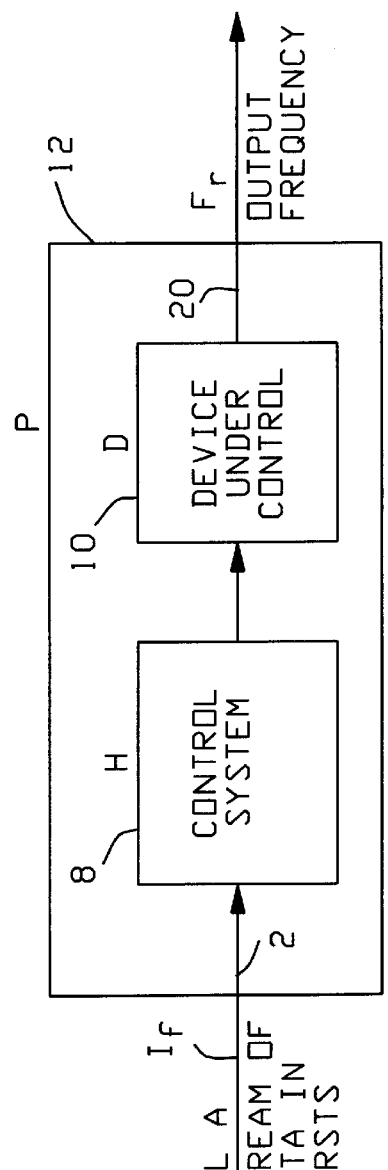
FIG. 2 CLOCK FREQUENCY CONTROL SYSTEM

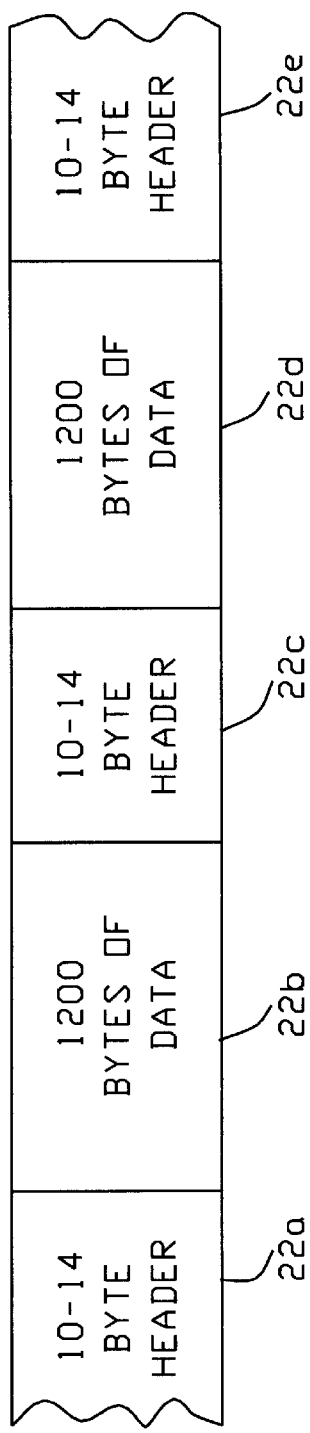
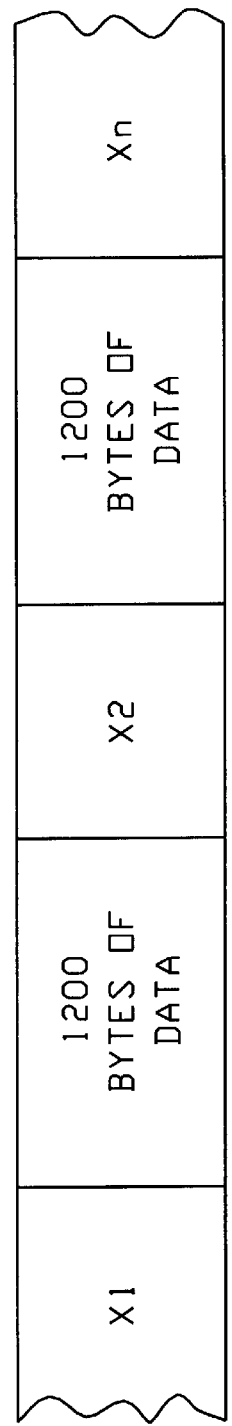
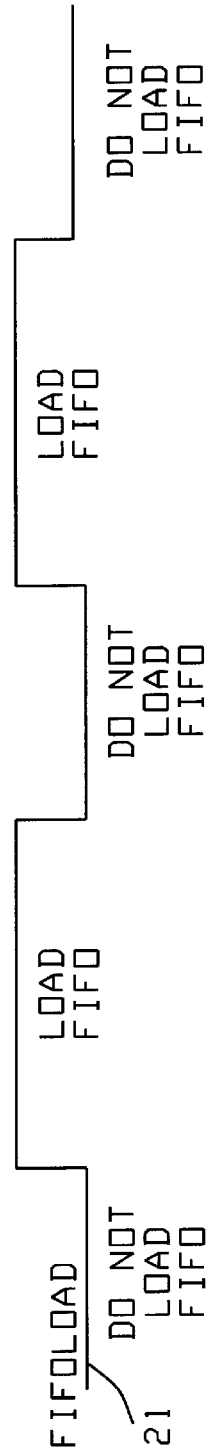

INPUT DATA SYSTEM

CONTROL LOGIC

FIFO IMAGE LOGIC

DRIVER CIRCUIT

PULSE LOGIC

CONTROL SYSTEM FOR RECREATING OF DATA OUTPUT CLOCK FREQUENCY WHICH MATCHES DATA INPUT CLOCK FREQUENCY DURING DATA TRANSFERRING

CROSS REFERENCES TO RELATED APPLICATIONS

This application is related to a co-pending application U.S. Ser. No. 08/919,389 entitled "Linear Function Generator Method with Counter for Implementation of Control Signals in Digital Logic."

This disclosure is also related to a U.S. Pat. No. 5,935,200 entitled "Exponential Relationship Generator Method and System for Implementation in Digital Logic."

FIELD OF THE INVENTION

This disclosure relates to methods using simple digital logic in order to control and re-create data frequency rates related to incoming data rates.

BACKGROUND OF THE INVENTION

In the development of circuitry and control systems for digital devices, it has long been a problem as to how to sufficiently implement logic circuitry in order to provide control signals to regulate and control associated circuitry or to control a target digital device.

In earlier periods of technology, analog signals and analog circuitry were used to generate analog signals which could be transmitted to analog target devices in order to control their operation. With the advent of digital logic circuitry and with the great flexibility for usage with Field Programmable Gate Arrays (FPGAs), and also with the use of Application Specific Integrated Circuits (ASICs), it is now possible that great efficiencies can be provided in using digital busses carrying multiple-bit digital signals which then can be digitally processed in order to provide desired or required output signals or control signals for target digital devices.

Many of the input/output and control signals in digital circuitry will be seen to have mathematical relationships to each other. Thus, with the use of what are called functional relationship generators, which can efficiently be implemented in digital circuitry, it can be found that there is considerably greater efficiency in using various signals and parameters in order to develop a desired output control signal for a controlled module.

The presently described system and method shows how mathematical and functional relationships of digital signals in the electronic circuitry can be represented by the use of simple standardized logic design elements. These systems and methods can be build into simple, industry-standard programmable logic elements, for example, such as PALs (Programmable Logic Arrays), or Field Programmable Gate Arrays (FPGAs).

The above cited co-pending applications illustrate various techniques for implementation in digital logic of certain electrical functional relationships. The above cited co-pending applications are included herein by reference. General overview:

FIG. 1A shows the basic diagram of a simple control system. The device 10(D) is the device under the control of a control system 8,H. The device under control 10(D) can exist in many different types of mechanisms, for example, the device D may be a physically positioning motor mechanism. Whatever the device 10 is, in any given situation, it produces some required action which is denoted in FIG. 1A as the desired action $F_r$.

Device 10(D) is controlled by the control system output signal on line 9o with a signal designated $Y_0$ which causes the device D(10) to take action toward a desired condition, parameter or position. Within the control system 8,H, there is a driver block 9(E) which creates and drives the output signal $Y_0$. The driver unit 9 uses its input signal Y on line 8x in order to create the output signal $Y_0$. Additionally, a functional generator circuit 4(G) creates the different signal Y from two inputs to the functional generator 4(G). The first input to functional generator G(4) is from outside the control system on line 2 and is designated as input signal, A. This is the main input control signal designated A. The second input signal is actually feedback from the device under control 10(D). This signal is in some way proportional to the activity or existing condition operating within the device 10(D).

If, for example, it is assumed that the device under control D(10) is a motor used to adjust the physical position of some object, then the signal $Y_0$ would be a voltage of the correct amount to cause the motor to turn and thus to move some object a required amount. In this example, the driver 9(E) would be a power amplifier circuit to provide the necessary voltage and current on line 9o to the assumed motor represented by device 10(D).

Also, the main input control signal A on line 2 from an outside module might be a voltage from some control switch or some variable resistance. If the device D(10) is already in the desired position, then the input signal A would be some zero value or some null value. Thus there would be no signal $Y_0$ and no further motion involved in the device D(10).

However, if an outside person or some other motivating device wished to move the device 10(D) to a new position, this outside operator would turn the variable resistance knob or else flip certain switches in order to indicate a new position that was desirable. Then the input signal A would take on a new value. In the example of FIG. 1A the feedback signal C on line 10/1 is also some voltage which represents the position of the device D(10). Here then, the functional difference generator 4(G) examines both signals A and C. If these signals are the same, then the device D(10) must already be where it is required to be and thus the signal $Y_0$ would be=0. However, if a new position is required, then A and C will differ, and $Y_0$ will represent some "difference" voltage. The driver 9(E) then amplifies the signal Y into an output signal $Y_0$ which is used to motivate or move the device D(10). As the device D(10) moves, it will cause a feedback signal C on line 10/1 to subtract from the input signal A until soon again the signal $Y_0$ is again equal to zero.

FIG. 1A also shows a second feedback signal designated C1 on line 10/2. This is done so that some control systems can provide multiple levels of feedback control. In the above example of FIG. 1A, if the C feedback signal involves some positional measurement, then the signal C1 might be some "velocity" measurement. Thus the control system 8(H) could then control how fast that the device D(10) moved to the desired position.

FIG. 1A is a basic simple control system description. The detailed disclosure herein describes a control system for controlling the frequency of a variable frequency clock system. As will be indicated in the subsequent disclosure, all but a very tiny portion of the control system will be found to be implemented in digital (and not analog) circuitry. Further, most of the circuitry can be implemented in simple digital logic within a programmable device such as a Field Programmable Gate Array (FPGA).

FIG. 1B is a generalized overview of the environment involved in the receiver module which is the focus of the present disclosure.

The origin, or transmitter end of the data stream can be a long-distance, miles away from the receiver end, where the clock re-creation occurs as discussed in the present disclosure. There is no clock signal connecting the two remote locations, that is to say, the transmitter and the receiver. The only connection is a data stream, that is to say, a serial data stream which can very in the rate of data being transferred.

At the origin of the user data as seen in FIG. 1B, the actual user data is clocked at the frequency $F_o$. This data frequency could be any number of values, but, for example, it might be a 155 MHz serial clock rate, which would be the equivalent of 19.4 MHz byte-wise. At the transmitter origin end, for the sake of proper transport, there is additional information (headers) which are inserted periodically between blocks of user data. Thus, since more information must be transmitted beyond that of the original user data, the serial data stream between the transmitter and the receiver is actually transmitted at a frequency somewhat greater than $F_o$.

At the receiving end of FIG. 1B, there is seen to be a serial data stream running at the transmitted frequency of "$F_0+$" which is extra for the headers. The clock data recovery circuit 30 (also shown in FIG. 6) derives this clock from the data stream after which it is designated as $I_f$. Thus, $I_f$ is the rate for all the received information, that is to say, both the user data and the extra headers. The receiver logic of FIG. 1B (which is detailed in FIG. 6) will strip away the headers and then re-create the actual user data clock rate $F_r$. This frequency rate $F_r$ will then be "equal" to the original clock $F_o$ which originated on the other end of the transport system at the transmitter location of FIG. 1B.

As a further note, the transported data stream is "bit serial" and contains both the original user data, plus approximately a 1% of additional information in the headers. At the receiver end, the system deals with "parallel" versions of these clocks, where the system has converted the serial data, as a series of bits, to "bytes" to permit the system to work with slower clock rates. As a typical example of the frequencies involved, the original user data clock rate on a serial bit basis, might be 155 MHz. The original user data clock rate on a "byte" basis using the original frequency $F_o$ could be 19.4 MHz. The transmitter rate, together with the headers on a serial bit basis, would involve a rate of 156.55 MHz.

At the receiver end, the receiver recovered clock on a byte basis, of the frequency $I_f$, could be 19.57 MHz, while the re-created user clock rate on a byte basis would have the frequency $F_r$ of 19.4 MHz.

As will later be seen in the subsequent description, the re-created user clock rate $F_r$ will operate to keep the FIFO 28 about the normal HALF-FULL position, which is designated as the optimum condition for operations.

SUMMARY OF THE INVENTION

A clock frequency control system, as seen in FIG. 5, is provided whereby variable streams of input data to a FIFO are controlled so that the output of the FIFO will provide a steady stream of stable output pulsed signals, while working to maintain the FIFO in the HALF-FULL condition.

The input data stream to the FIFO 28 is also fed to a control system where a difference generator provides a control signal Y to a driver 9(E) which provides a control signal Yo to a variable oscillator device 10(D). The variable oscillator device 10 provides an output frequency $F_r$ which is fed to the difference generator G(4) and to the FIFO 28 on line 26. Additionally, the FIFO 28 provides a FIFO status signal back to the difference generator 4 to indicate the FIFO's condition as being FULL, HALF-FULL, or EMPTY. The effect of the control system 12, which uses the difference generator 4 and the variable control oscillator 10 to provide the output frequency $F_r$, is to maintain the FIFO 28 in a condition where it will operate at or near the HALF-FULL capacity range.

The majority of elements are implementable in Field Programmable Gate Array circuitry which can be utilized within the spare gates of already provided-for gate arrays, which generally reside in these data transfer systems. Thus, very little expense and complexity is required in order to implement such a control system to control the outputs of the FIFO on a steady normal basis, while the inputs to the FIFO may vary in bursts from short bursts of data to long bursts of data, and short pulses of data to long pulses of data. Thus, the random factors of the input signals are smoothed out to form a stable "normal" output rate data signal for reading out the data.

BRIEF DESCRIPTION OF THE DRAWINGS

FIG. 1A is an illustration of the basic configuration for a simple control system.

FIG. 2 is a basic block diagram of the control system described in the present disclosure;

FIG. 3A is an illustrative example of a data stream showing byte headers and bytes of data;

FIG. 3B shows a data stream with the headers removed;

DESCRIPTION OF THE PREFERRED EMBODIMENT

A basic block diagram of the clock frequency control system is shown in FIG. 2 and indicated as block 12(P). The purpose of 12(P), is to output a clock signal, $F_r$, whose frequency "exactly" matches a particular frequency that is somewhat hidden within the input signal A on line 2, of FIG. 2.

As seen in FIG. 2, the clock frequency control system 12 involves a stream of "data" in bursts shown as signal A on input line 2. This is fed to the control system 8(H), which then provides an output to the device under control 10(D), which then provides an output frequency signal $F_r$ on line 20.

The input signal A in the described system, is a stream of data bytes. However, it should be noted that data in this stream of data bytes is not a continuous stream. The input stream A operates at some particular clock frequency denoted as $I_f$ for Input Frequency.

As seen in FIG. 3A, the data stream "A" contains blocks of 1200 bytes of data indicated as 22b and 22d, separated by small "header" streams which may vary between 10 and 14 bytes long. In FIG. 3A, these are indicated as items 22a, 22c, and 22e. This "header" stream is removed and subsequently discarded as will be indicated hereinafter. Thus, the incoming stream A, is seen to be likened to bursts of 1200-byte blocks at the input frequency $I_f$.

FIG. 3B shows the data stream with the variable headers 22a, 22c, 22e, being removed. In FIG. 3B, the prior blank blocks of time formerly occupied by the headers of FIG. 3A are now denoted as X1, X2 . . . Xn. Each of these blank blocks can be the equivalent of 10, 12, or 14 bytes long.

FIG. 3B also shows the time periods wherein the FIFO 28 (which receives the data bytes) is loaded and not loaded. Thus, during period X1, there is no loading of the FIFO, as is also true at time period X2, and at time period Xn. Similarly, the 1200 bytes of the data stream are loaded into the FIFO at the areas marked "load FIFO".

Figure 4:
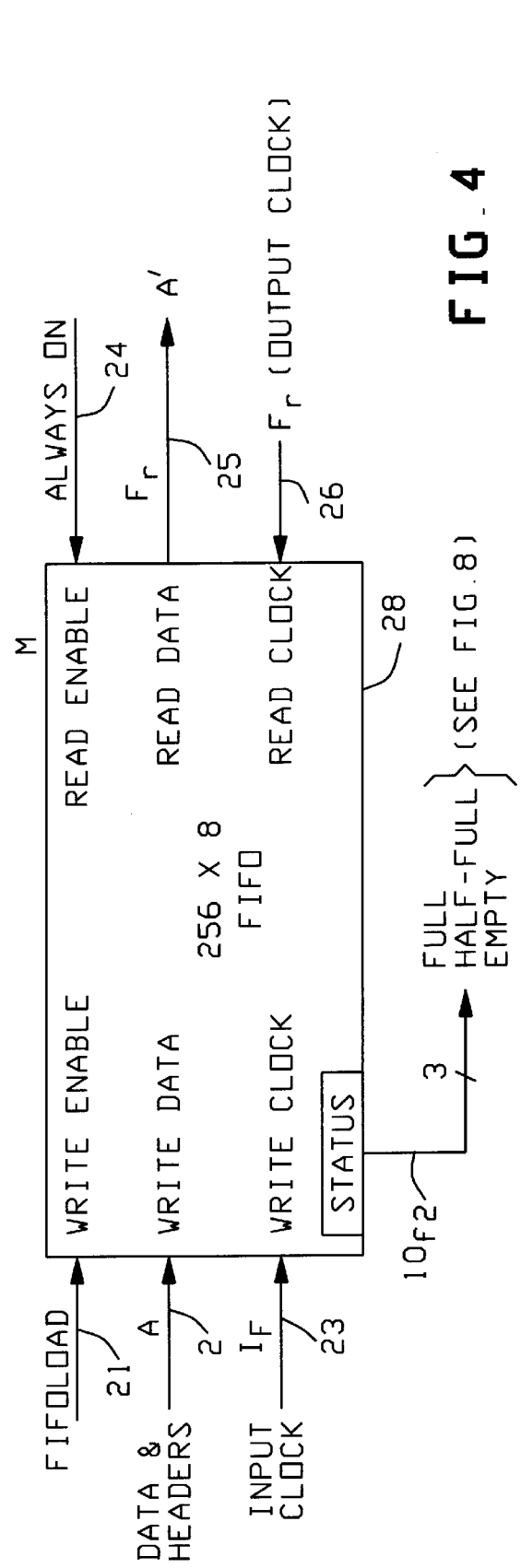
FIG. 4 is a diagram illustrating a portion (FIFO) of the data path for the data stream.

FIG. 4 shows a portion of the data path (FIFO) involved in the data stream. It may be noted in this situation, that the actual source and the use of data stream is not relevant to the usage of the described modules. The data A on line 2 is seen to flow into the FIFO device 28(M). This FIFO device 28 operates at two separate asynchronous clock frequencies. The data is written into the FIFO 28 on line 23 at the previously mentioned input clock frequency $I_f$. Then, the data is read out of the FIFO 28 at the desired control system clock frequency $F_r$ at A' on line 25.

Data is written in bursts into the FIFO 28 of FIG. 4 on line 2 indicating the signal A. The signal called FIFOLOAD in FIG. 3B will be seen to control this function. This signal FIFOLOAD is tied to the detection and removal of the header blocks. Thus, in FIG. 4, the FIFOLOAD signal on line 21 is the Write Enable signal to the FIFO 28. The data and headers for signal A enter on line 2 to provide the Write Data signal.

Line 23 shows the input clock frequency $I_f$ as the input clock.

In FIG. 4, the FIFO 28 has a Read Enable signal incoming on line 24 and also an output clock signal on line 26, which functions to read the clock. This signal is designated $F_r$.

Data is read out continuously out of the FIFO 28 at the frequency $F_r$ on line 25(A') which frequency is created by the control system described in FIG. 2. The output data stream A' on line 25 is a smooth continuous stream of only the user data bytes at the newly re-created frequency $F_r$.

It follows that clock $F_r$ is somewhat less than the input clock rate of $I_f$. But whereas the incoming data is in higher speed bursts with discarded headers in between bursts, the output data is at a slightly slower but "steady" rate of $F_r$. This output rate, $F_r$, is a "re-created" version of the actual data rate (without any inserted header information).

In FIG. 4, the input data stream A on line 2 incoming to the FIFO 28 is made up of the combination of the desired data bytes (FIG. 3A) and the added header bytes.

Figure 1B:
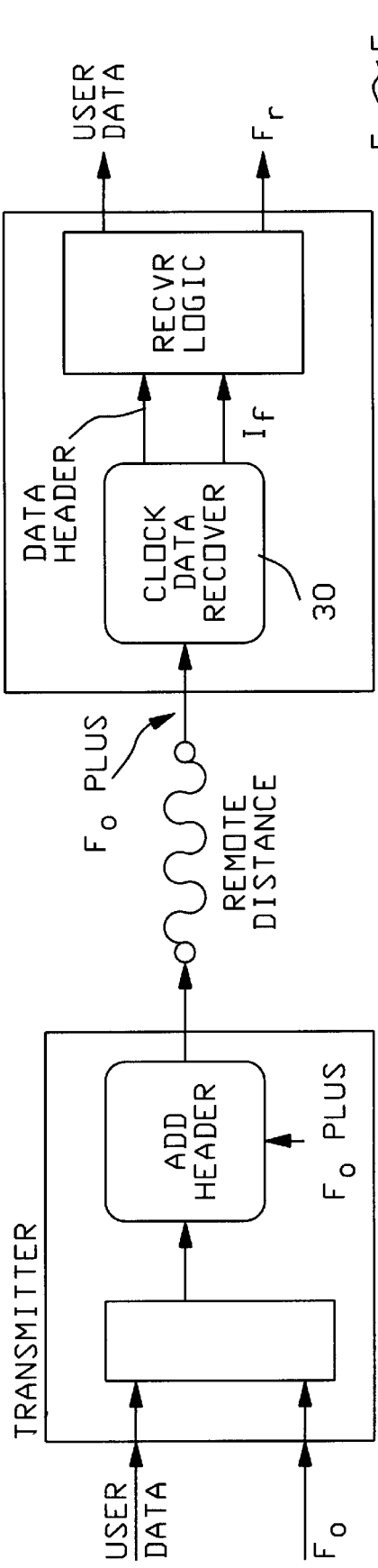
FIG. 1B is a drawing of the generalized environment in which the received data stream operates.

The focus of the logical elements in this disclosure involve the receiving end of a data transport system. The transmitting side of this transport system is the location where the data bytes have originated. For example, these may have originated in some user's equipment and were originally clocked at a clock frequency which may be referred to as Fo, (FIG. 1B) or the original frequency. This original clock frequency of the original data, designated Fo, is the frequency that the control system will be attempting to re-create as the frequency $F_r$.

At the transmitting end (FIG. 1B) of this transport system, the original data bytes are combined with the header bytes, and the entire stream is re-transmitted at a higher intermediate clock frequency, designated as $I_f$, also shown in FIG. 4.

The header bytes serve several functions in the transport mechanism, but here most notably, they serve the function of what is known as "bit-stuffing". This accounts for the variance in the length of the header stream from 10–14 bytes long. The idea of "bit-stuffing" is a means by which more or fewer "overhead" bits are inserted into the overall data stream in order to adjust for changes which occur in the clock frequency.

The receiving end of this particular transport system may be remote from the "transmitting" end by a great distance, perhaps even hundreds of miles. The one and only connection between the two ends, that is to say, the "receiving" end and the "transmitting" end is a combined data stream which is traveling at the intermediate clock frequency of $I_f$. However, it will be seen that it is necessary, at the "receiving", end to present to the user, the original data stream as being restored to the original clocking rate Fo. Thus, at the receiving end, it is necessary to re-create this original clock frequency Fo, from the only tool available, that is to say, the data stream. Thus, the particular control system described herein makes a new frequency $F_r$ equal to the original frequency Fo.

Referring to FIG. 4, it is seen that the input data stream A on line 2 coming into the FIFO 28 is loaded at the clock rate of $I_f$ (the intermediate frequency) intermittently, but not on a continuously sequential basis. What gets loaded into the FIFO 28 is only the original user data, since all added header bytes have been stripped-off by not writing them into the FIFO 28.

On the output end of the FIFO 28, data is taken out at a continuous pace, but at a slightly slower frequency $F_r$. It is important to note that if $F_r$ is not exactly equal to the rate at which the user bytes of data are written into the FIFO 28 "on average", the FIFO 28 will eventually overflow and incoming data will be lost.

Conversely, if $F_r$ is too fast compared to the "average" user data byte input rate, then eventually the data on the output end of the FIFO 28 will "underflow", that is to say, some data will be read twice. Both of these are unacceptable conditions. Therefore, the output clock frequency $F_r$ must be re-created to "exactly" equal the "average input rate" of the user data. This is the function that the disclosed control system provides for the transport mechanism.

The FIFO 28 of FIG. 4 provides a "status" signal output on line $10f_2$ (3 bits) which signify that the FIFO is FULL, HALF-FULL or EMPTY. The status signals are fed to Image Counter 43i of FIG. 8.

Figure 5:
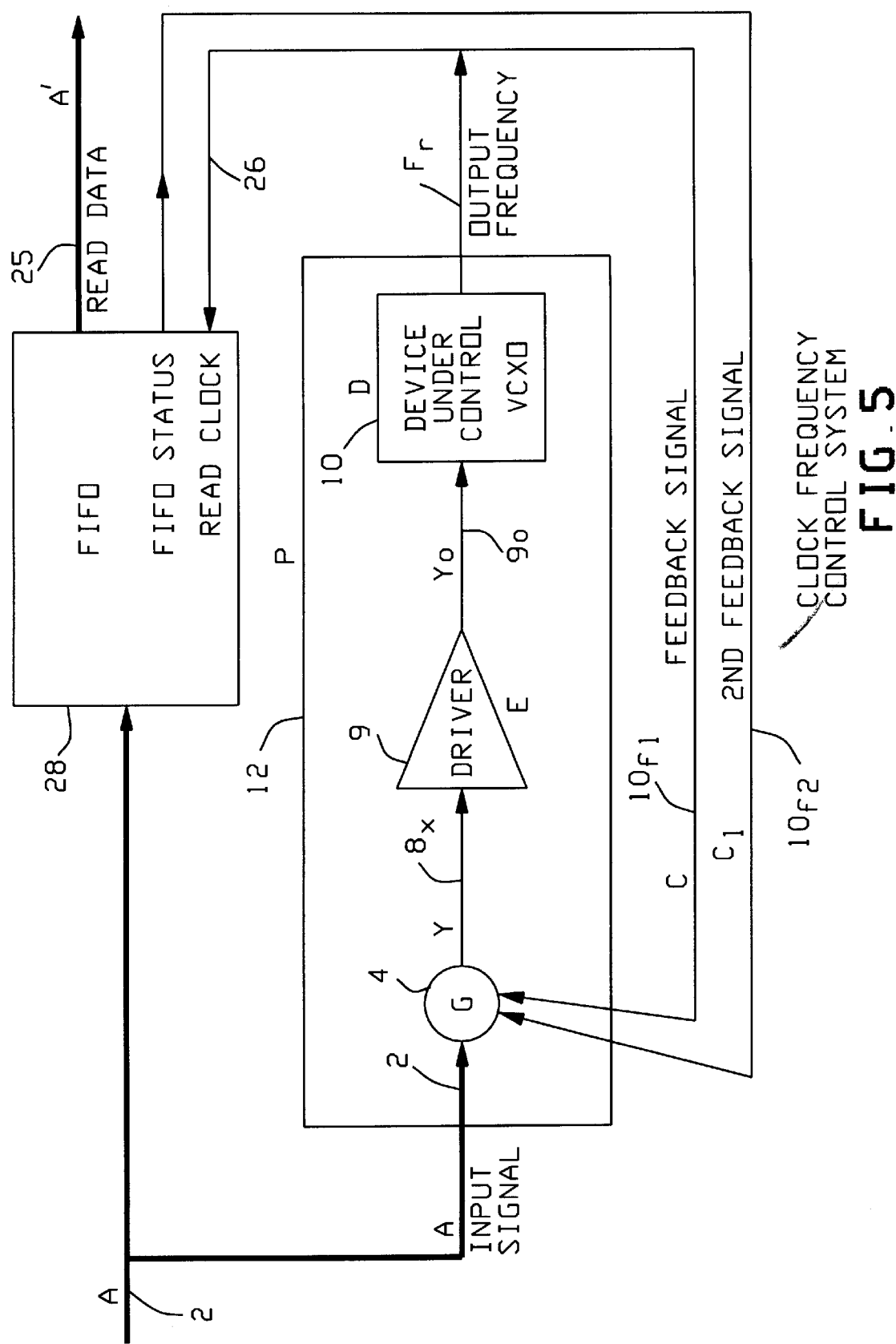
FIG. 5 illustrates a diagram for mixing the FIFO with the control system module.

General Control System:

FIG. 5 illustrates a diagram mixing the FIFO 28 with the control system 12(P). In this figure, the device under control D,10, is a special clock frequency circuit called a "Voltage Controlled Oscillator" (VCXO). This is a standard-industry chip which creates an output clock signal around an internal middle frequency specified at the time of purchase of the chip. However, the VCXO 10 allows the actual output clock frequency to vary slightly up or down around the middle frequency. It is called a voltage controlled variable oscillator circuit. The control of the actual frequency is done via an input control voltage signal, such as the signal Yo on line 9o of FIG. 5. As this control voltage input to the VCXO 10 increases, so does the output frequency $F_r$. As this control voltage is lowered to the VCXO 10, the output frequency decreases as well. Thus, with this relatively inexpensive industry-standard element, it is possible to control the output frequency by controlling the input control voltage level. This is somewhat analogous to moving some physical object with a motor by applying some specific voltage to the motor inputs. However, in the present case, the system is not moving an object, but rather re-creating an "exact" clock rate frequency, "hidden" within an incoming stream of data.

The control system 12(P) thus provides a means to vary the input control voltage being fed to the VCXO 10 and thereby is able to control the frequency of the output clock $F_r$. The input control voltage is seen to be the signal Yo in FIG. 5. The driver block 9 supplies the specifically required input control voltage Yo.

The input signal to the driver block 9 is designated as Y on line 8x. The control system builds the Y signal from three sources in the system. The first source is from the input data stream A on line 2. Secondly, the Y signal is built from two separate feedback signals. The first feedback signal is the output frequency itself $F_r$, which is fed back as the signal C on line 10/1. The second feedback signal is designated as C1 on line 10/2, and involves three status indicators from the FIFO 28, which represents the FIFO status, as was indicated in FIG. 4.

A special feature of the control system described herein is its very simple, soft implementation. The FIFO device 28 itself is a standard-industry available chip from Cypress corporation. The VCXO 10 is a standard chip also. The driver 9 is the only analog circuit involved and will be seen to be a very trivial item in the system. Lastly, all the remaining elements of the design are implemented as a small portion of one Field Programmable Gate Array, FPGA, such as manufactured by the XILINX Corporation. However, only approximately 7% of the Field Programmable Gate Array is required for implementation.

Figure 6:
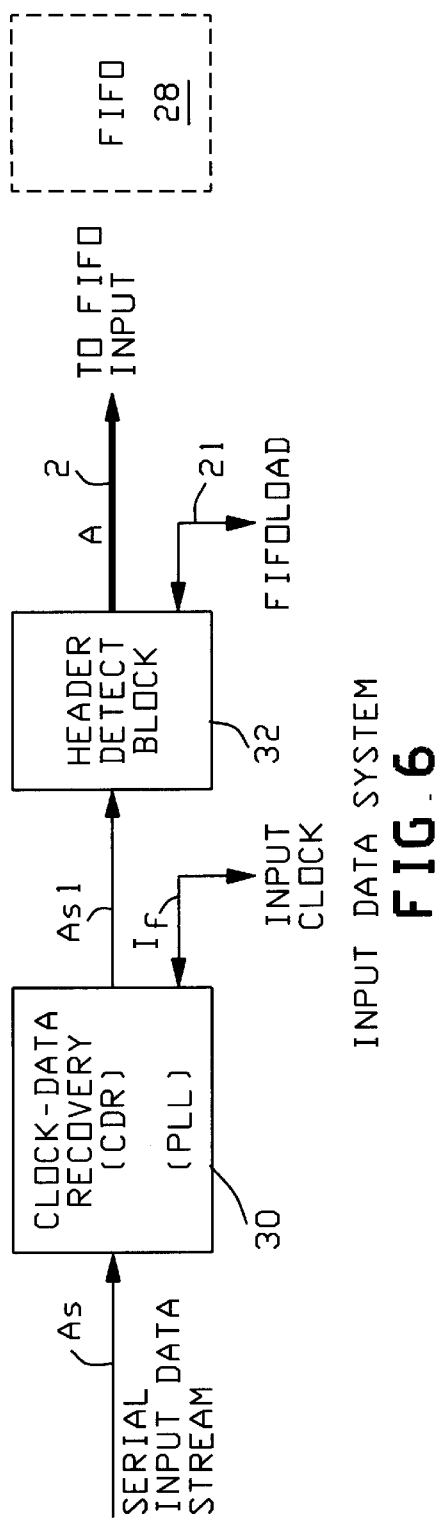
FIG. 6 is a drawing showing the addition of two circuit blocks added to the data path of the receiver on the input data stream A.

Input Signal Usage:

It will be firstly useful to discuss the usage of the input data stream. FIG. 6 illustrates two circuit blocks added to the data path of the receiver of the transport system of the input data stream A on line 2. The first block is a standard Clock-Data Recovery circuit (CDR). The CDR circuit 30 of FIG. 6 is basically a phase-locked loop device which "makes" clock signals and data signals from an input serial data stream designated As. Thus, the serial version of the input data stream, As, is used by the CDR 30 to create the input clock signal $I_f$. Thus, the input clock signal is represented as $I_f$.

The serial data stream As1 (FIG. 6) output from CDR 30 passes then through a second logical block 32, called the "Header Detect Block". This block converts the serial data stream into a parallel data stream designated A (on line 2), which is fed to the FIFO input line of FIG. 4. Also, this header detect block 32 detects the inserted header bytes, then locks onto the their proper framing, and then provides for their being stripped-away by the signal FIFOLOAD, shown in FIG. 3A. The locking is achieved by detecting a fixed pattern, and by counting the appropriate counts within and between header streams. The locking mechanism operates by "skipping" $I_f$ clocks, when necessary, so that this block establishes the proper framing. Once so locked, the framing relationship can continue indefinitely.

The parallel data stream A on line 2 of FIG. 6 is derived exactly from the serial stream As, then continues on to the FIFO 28 of FIG. 4. The two created signals designated $I_f$, and the FIFOLOAD, together will represent exactly the signal "A" data stream for usage of the described control system. Thus, it is seen that the input stream is clocking at the frequency rate of $I_f$. Further, the FIFOLOAD signal (FIG. 3A) specifies when the user data (not the header bytes) are present. Together then, the control system can use these two signals to exactly discover the "average user" data clock rate.

Figure 7:
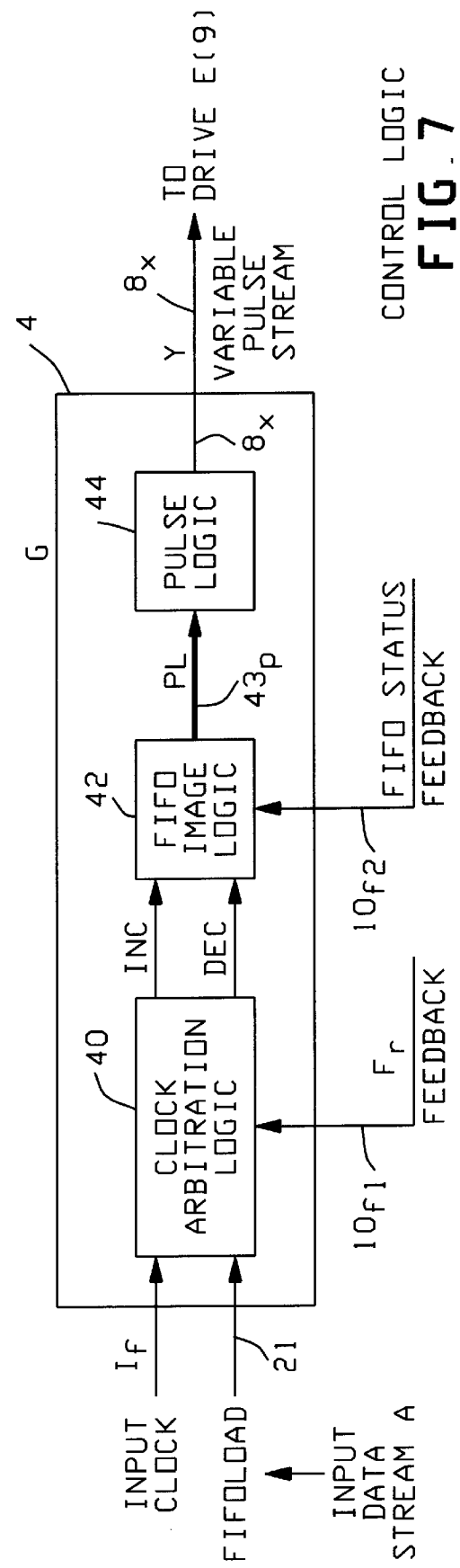
FIG. 7 is a drawing showing the expanded "functional difference generator," G(4) of FIG. 5 of the overall control system.

Creation of the Driver Input Signal Y:

FIG. 7 shows the "functional difference generator" for designated block 6(G) of FIG. 5 of the overall control system. The difference generator 4 (FIG. 5) takes the input data signal A, plus the two feedback signals so as to generate the difference value Y to the driver circuit 9(E). By noting that the input stream A is now logically represented by two signals which are the input clock $I_f$, and the FIFOLOAD signal, it will be seen that the output clock frequency $F_r$ is one of the feedback items. The other feedback item is the status information from the FIFO device 28.

Thus, the circuit blocks shown in FIG. 7 will be seen to create a variable stream of pulses, which the driver 9(E), will use to create the desired input control voltage to the VCXO device 10 in order to vary the clock frequency of $F_r$.

The implementation of the three blocks shown in FIG. 7 which are designated as the clock arbitration logic 40, the FIFO image logic 42, and the pulse logic (PL) 44, are all implemented within the FPGA hardware. These are at the crux of the control system operation. These three logical blocks are needed to create the signal Y on line 8x. Thus, the clock arbitration block 40, which has an input clock $I_f$ and an input of the FIFOLOAD signal plus an input of the feedback signal $F_r$, then operates to feed the FIFO image logic 42, which then in turn, controls the "pulse" stream cessation logic of block 44 (PL) with the resultant variable pulse stream signal Y on line 8x used to feed the driver 9(E).

Clock Arbitration Logic 40:

The clock arbitration logic 40 (FIG. 7) serves three purposes;

a) It synchronizes the two asynchronous clock signals $I_f$ and $F_r$ to form a common clock. Here, clock $I_f$ is used as the "base" clock.

b) It creates an incrementation signal INC which is based on the input clock frequency $I_f$.

c) It creates a decrement signal, DEC, which is based upon the feedback clock frequency $F_r$.

The clock arbitration logic 40 provides a series of operations which are described by detailed logic equations. The detailed logic equations of the clock arbitration block are shown hereinbelow in Table I.

TABLE I

CLOCK ARBITRATION LOGIC

| FLIP-FLOP equations (note: / is inversion; + is logical-or; * is logical-and) | Flip-Flop purpose (F) |
|---|---|
| F1: D = F1/<br>CLOCK = $F_r$ | divide by 2 |
| F2: D = F1 * F2/ + F1/ * F2<br>CLOCK = $F_r$ | divide by 2 again |
| F3: D = F3/<br>CLOCK = F2 flip-flop output<br>CLEAR = F5 | synchronize |

TABLE I-continued

CLOCK ARBITRATION LOGIC

| FLIP-FLOP equations (note: / is inversion; + is logical-or; * is logical-and) | Flip-Flop purpose (F) |
|---|---|
| F4: D = F3 * F5/ CLOCK = $I_f$ | synchronize to $I_f$ |
| F5: D = F4 * F5/ CLOCK = $I_f$ | synchronize to $I_f$ |
| I4: D = I1/ * FIFOLOAD CLOCK $I_f$ | divide-by-2 |
| I2  D = I1 * FIFOLOAD/ * I2/ + I1/ * FIFOLOAD * I2 CLOCK = $I_f$ | divide-by-2 again |
| I3: D = I3/ CLOCK = I2 flip-flop output CLEAR = I4 | synchronize |
| I4: D = I3 * I4/ CLOCK = $I_f$ | synchronize |
| INC = I4 * F5/ | increment |
| DEC = I4/ * F5 | decrement |

The clock arbitration logic block 40 of FIG. 7 is mainly composed of flip flops (F). Within this logic, each of the incoming clock signals $I_f$ and $F_r$ will pass through two flip-flops. The effect of these two flip-flops for each clock is to produce a signal based upon that clock, but operating at one-fourth (¼) of the clock's frequency.

Thus, in the clock arbitration logic of Table I, the signal I2 operates at ¼ of the clock signal $I_f$. The signal F2 operates at ¼ of the clock signal $F_r$. This provides a standard "divide by 4" design. It may be noticed that I2 only occurs when FIFOLOAD is active (it does not occur for the header bytes).

Flip-flop F3 follows flip-flop F2, but is cleared by an asynchronous clear signal. Flip-flops F4 and F5 will be seen to now synchronize F3 to the other clock, $I_f$. When F5 comes "on", it asynchronously clears the flip-flop F3. Thus, the signal F5 is based upon ¼ of the $F_r$ rate, but is now synchronized to the $I_f$ clock rate.

The flip-flops I3 and I4 will operate similarly for the $I_f$ clock. Thus, I4 is based upon ¼ of the $I_f$ rate, and is also synchronized to this particular clock rate.

The signals INC and DEC can be created for any $I_f$ clock time. When I4 is present and F5 is not present at any given $I_f$ clock time, then the increment signal INC will be set for a single clock time. When the F5 signal is present and I4 is not present at a given $I_f$ clock time, then the decrement signal DEC will be set for a single clock time. When both F5 and I4 are present together, then neither the increment INC or the decrement DEC signals are set at that clock time.

Figure 8:
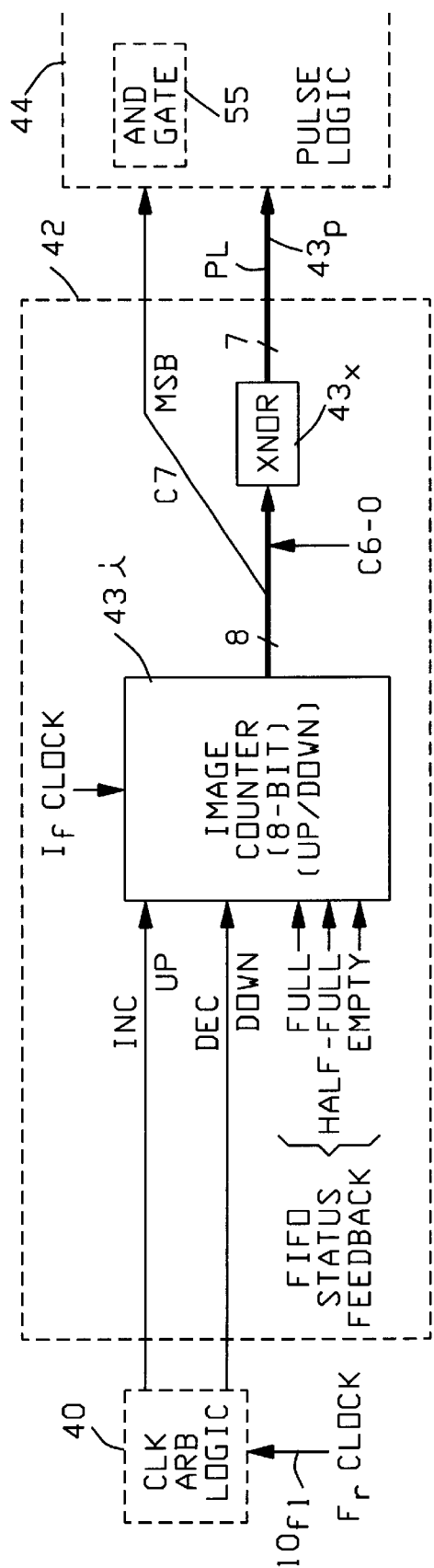
FIG. 8 is an illustration of the FIFO image logic block which creates an image count representative of the internal state of the FIFO device through which the actual data flows.

Thus in summary, the clock arbitration block 40 produces two signals synchronized to the $I_f$ clock. One signal is to an incrementation function based upon the $I_f$ clock rate, and the second signal is for decrementation based upon the $F_r$ clock rate. The actual increment and decrement controls operate at ¼ of the respective clock rates. Thus, this level of resolution is found to be sufficient for the control system. As a further note, the signal INC can only occur for one clock when the signal FIFOLOAD is high—not including the header bytes.
FIFO Image Logic 42:

The FIFO image logic block 42 of FIG. 7 creates an image count which is representative of the internal state of the FIFO device 28 through which the actual data flows. FIG. 8 is a drawing illustrating the elements of the FIFO image logic 42.

The heart of the FIFO image logic 42 is, as seen in FIG. 8, the 8-bit, binary up/down counter called the "Image Counter 43i". This counter operates on the $I_f$ clock signal.

The Image Counter 43i increments (counts up) on the INC signal, which is based upon the input clock frequency $I_f$ when the signal FIFOLOAD is "on". The Image Counter 43i decrements (counts down) on the DEC signal which is based upon the $F_r$ clock. Thus, the value in the image counter 43i is proportional to the "difference" between the average $I_f$ clock for user data bytes (FIFOLOAD=1) and the control system output clock frequency $F_r$. The image counter 43i increments when the FIFO 28 is being written with user data; it decrements when data is being removed (read out) from the FIFO 28.

Besides counting, the Image Counter 43i is pre-loaded (parallel loaded) to three possible values based upon three status feedback signals from the FIFO device 28. This is seen in FIG. 8. If the FULL status signal is active, then the Image Counter is loaded to a value of "FF" (hexadecimal) indicating a FIFO FULL condition. If the EMPTY status signal is active, then the Image Counter 43i is loaded to a value of "00" (hexadecimal) indicating a FIFO EMPTY state. If the HALF-FULL status signal is active, then the Image Counter 43i is loaded to a value of "10" (hexadecimal) indicating that the FIFO is HALF-FULL. The use of these three feedback signals continuously re-aligns the Image Counter 43i to the real state of the FIFO 28.

The FIFO FULL and FIFO EMPTY conditions should never occur in normal operation, except only when first initializing the hardware. These conditions are used as error indications to system operating personnel. The FIFO HALF-FULL condition should occur normally and very often. When the control system output clock $F_r$ is at the correct frequency, then it will "exactly" match the "average input user" data rate (with the header bytes removed). Thus, the FIFO 28 should load and unload at nearly the same rate during its time of operation. The input load rate is slightly faster, since If is faster than $F_r$, but it is done in bursts. Thus, the FIFO 28 should move back and forth through the HALF-FULL position most of its operating time. The FIFO status feedback causes the Image Counter 43i to be regularly re-aligned to the "HALF-FULL" state, thus providing a sort of a self-correcting system operation.

The output of the Image Counter 43i is the key to creating the difference value Y of FIG. 1 and FIG. 7 on line 8x. The most significant bit C7 (FIG. 8) is useful for quickly determining where the FIFO operating condition is. If C7 (msb) is low, then the FIFO 28 is less than HALF-FULL. If C7 is high, then the FIFO is more than HALF-FULL.

Table II shows the output bits (8 bits) of the Image Counter 43i. "C7" is the most significant bit. "C6–0" represents the counter bits 6 to 0 (least significant bit).

The lower 7-bits (C6–0) of the Image Counter 43i of FIG. 8, are used to determine how far from the middle, (the HALF-FULL position) the FIFO is in regard to the loading of the FIFO 28. These 7-bits will be seen to pass through an Exclusive-NOR gate structure 43x (FIG. 8). Each bit of the 7-bit field is Exclusively-OR'd with bit C7, and then the result is inverted. This function produces an output which is the magnitude of "how far" the FIFO 28 loading is from its desirable mid-point. The Table II shown below will illustrate this functional activity.

TABLE II

XNOR FUNCTION

| Image Counter (43i) | | XNOR (43x) |
|---|---|---|
| C7 | C6-0 | OUTPUT PL (43p) |
| 0 | 000 0000 | 111 1111 |
| | | empty extreme |
| 0 | 000 0001 | 111 1110 |
| 0 | 000 0010 | 111 1101 |
| - | - - - | - |
| 0 | 111 1101 | 000 0010 |
| 0 | 111 1110 | 000 0001 |
| 0 | 111 1111 | 000 0000 |
| | | mid-point |
| 1 | 000 0000 | 000 0000 |
| | | mid-point |
| 1 | 000 0001 | 000 0001 |
| 1 | 000 0010 | 000 0010 |
| 1 | 000 0011 | 000 0011 |
| - | - - - | 000 0001 |
| 1 | 111 1110 | 111 110 |
| 1 | 111 1111 | 111 1111 |
| | | full Extreme |

As seen in Table II, the left-hand column shows the 7-bits of the Image Counter 43i and the most significant bit C7. The right-hand column shows the output of the Exclusive NOR gate as related to the value of the bits in the Image Counter. As will be noted, the Exclusive NOR gate output "mid-point" area indicates when the Image Counter 43i reflects mostly all "1's" or mostly all "0's".

Thus, as seen in FIG. 8, the new value from this Exclusive NOR block 43x is seen to be a 7-bit signal on line 43p, which presents a value proportional to the magnitude of "how far" the average input data rate is from the generated output clock $F_r$. A small value for the signal PL on line 43p, indicates that the two rates are nearly identical. A larger value for the 7-bits of PL indicates that the two rates are farther apart. This information with the bit C7 indicates whether the FIFO 28 is tending toward a FULL condition or an EMPTY condition, which is useful in controlling the final output clock rate F Pulse logic 44:

The FIFO image block 42 (FIG. 8) provides two important values regarding the state of the FIFO 28 and also the frequency relationship between the incoming data stream (average) and the control system output clock $F_r$. The 7-bit bus 43p holding the signal PL, indicates the magnitude of the frequency difference and also bit C7 which indicates in which direction they differ from each other, that is to say, whether the frequency difference is higher than the average or lower than the average.

As seen in FIG. 7, the final stage in producing the difference signal Y on line 8x is the Pulse Logic 44. This block creates a variable stream of pulses used by the driver 9(E), FIG. 10, to produce the input control voltage to the oscillator 10, VCXO, (FIG. 10) in order to produce the input control voltage Yo on line 9o to the oscillator VCXO.

Figure 9:
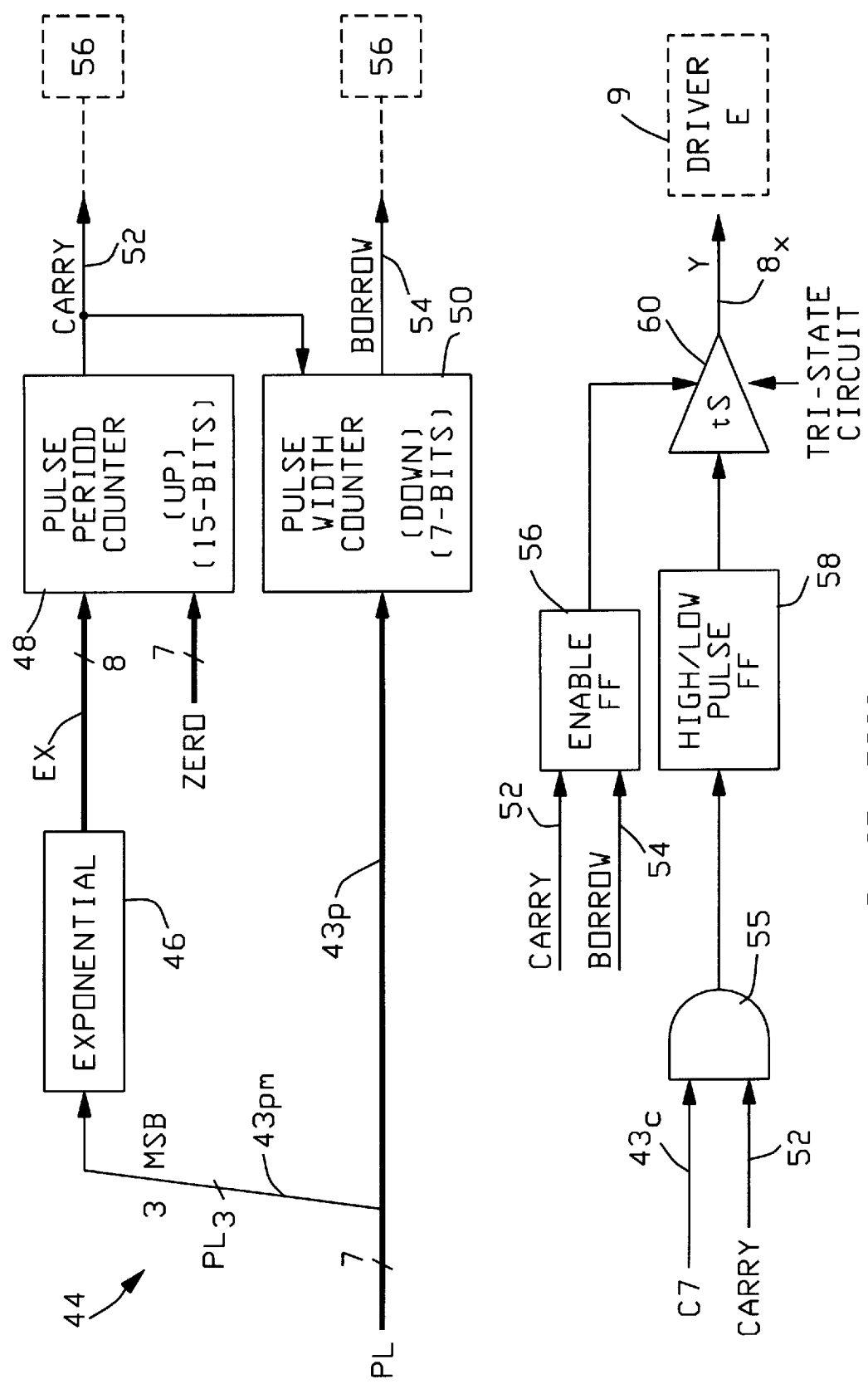
FIG. 9 is a drawing showing the elements of the pulse logic of FIG. 7.

The pulse logic block 44 of FIG. 7 is shown in greater detail in FIG. 9. The three most-significant bits (PL3) of the pulse logic PL are bled off into a functional conversion block designated "exponential" 46. This block then creates an 8-bit output signal EX from the 3-bit field which is the exponential power of 2, where the 3-bit field (MSB) is the exponent. This 8-bit power of 2 value is loaded into the upper 8-bits of the Pulse Period Counter 48 (FIG. 9). The lower 7-bits of this 15-bit counter are loaded to "0". Table III shown below indicates the exponential functions involved.

The exponential function can be expressed as $$EX=2^{(PL3+1)}-1$$

where PL3 is the upper 3 bits of the PL bits.

TABLE III

EXPONENTIAL FUNCTION OPERATION

| PL3 (exponent of 2) (3-bits) | Exponential OUTPUT $Ex=2^{(PL3+1)}$ |
|---|---|
| 111 | 1111 1111 |
| 110 | 0111 1111 |
| 101 | 0011 1111 |
| 100 | 0001 1111 |
| 011 | 0000 1111 |
| 010 | 0000 0111 |
| 001 | 0000 0011 |
| 000 | 0000 0001 |

As seen in Table III, the column designated Pulse Logic (PL3) shows various 3-bit values. Then, on the right side designated as "Exponential Output", there is seen the digital value in 8-bits which indicates that the three PL3 bits have been raised to the powers of 2, such the $2^{(PL3+1)}-1$ will result in the exponential output EX shown in Table III. The Pulse Period counter 48 is loaded to the above power of 2 value each time the counter 48 hits its upper limit, which is "7FFF" (hexadecimal). At this point, it also produces the CARRY signal on line 52 for a single clock time. This counter 48 counts every $I_f$ clock time, except when it is loading.

The Pulse Period Counter 48 represents how often the pulse occurs in the variable pulse stream on the signal Y on line 8x. This is an unusual feature of the present system . Due to the exponential function to which it is loaded, the period between pulses on line 8x designated as "Y," varies exponentially as the FIFO 28 moves away from its mid-point.

Thus, if the FIFO 28 is HALF-FULL, then the period between the Y pulses is very, very long. If, however, the FIFO 28 is not at HALF-FULL, then the "period" between Y pulses is not as long. The farther the FIFO is from its desired mid-point, which is HALF-FULL, the more often the Y pulses will occur and the shorter will be the pulse period.

As seen in FIG. 9, a second counter 50 designated the Pulse Width Counter, is loaded with all 7 bits of the pulse logic signal (PL) on line 43p in a direct fashion. The second counter 50 is also loaded when the CARRY occurs on line 52. Likewise, this counter 50 decrements, on every $I_f$ clock time, the count of the pulse where counter 50 represents the "Width" of the pulses on the signal Y. When the Pulse Width Counter 50 has reached its limit at "00" (hexadecimal), then it will output the signal "BORROW" on line 54 for one clock time.

Since the Pulse Width Counter 50 is loaded directly with the magnitude value of the pulse logic signal PL on line 43p, then its counting time (that is the Pulse Width) will be a linear (directly proportional function of the magnitude the FIFO status that the FIFO is from being HALF-FULL). If the FIFO is very near the HALF-FULL position, then the pulses on the signal Y will be very narrow. If the FIFO is quite far away from the HALF-FULL position, then the pulses on the signal Y will be quite wide.

The pulse stream Y on line 8x is shown in FIG. 9 occurring as the result of two flip-flops 56 and 58, which create the pulses for the difference signal Y. The enable flip-flop 56 is fed by the CARRY signal on line 52 and the BORROW signal on line 54. The high/low pulse flip-flop 58 is fed by the AND gate 55 which has inputs designated as CARRY on line 52 and the most-significant bit C7 of the pulse logic on line 43c.

The enable FF 56 controls the tri-state circuit 60 which has an input from FF 58 and an output to the tri-state circuit 60. The output signal from 60 constitutes the signal Y to the driver 9.

Each pulse on the output signal Y has one of three voltage states. Also, each pulse on the output signal line Y has a variable duration (Width). Further, the time between each pulse on the output signal Y is a variable which is "exponential". Shown below is Table IV which describes the state of the pulses for the signal Y on line 8x.

TABLE IV

STATES OF PULSES FOR Y SIGNAL (FIG. 9)

| Pulses on Y State | DESCRIPTION |
|---|---|
| TRI-STATE | Tri-state is the normal value of the Y signal. When Y is tri-stated, it has NO affect on the input control voltage to the VCXO, 10. Thus, when tri-stated, Y has NO affect on the frequency of $F_r$. |
| High Voltage Pulses (logical one) | The high level pulses are positive voltage pulses on Y. High pulses on Y will tend to increase the input control voltage to the VCXO, 10. Thus, high pulses on Y will tend to increase the frequency of $F_r$. |
| Low Voltage Pulses (logical zero) | The low level pulses are "ground" pulses on Y. Low pulses on Y will tend to decrease the input control voltage to the VCXO. Thus, low pulses on Y will tend to decrease the frequency of $F_r$. |
| Pulse Width | The longer is the duration (width) of pulses on Y, the greater affect will Y have on the input control voltage to the VCXO. This applies equally to high and low voltage pulses on Y. |
| Pulse Period | The more often that pulses occur on Y, the much greater affect will Y have on the input control voltage to the VCXO. This applies equally to high and low voltage pulses on Y. The period of pulses on Y has a greater affect than does the width of pulses on Y. |

The two flip-flops 56 and 58 of FIG. 9 will create the pulses for the signal Y on line 8x. A pulse will occur following the CARRY signal on line 52. The CARRY signal sets the enable flip-flop 56 which allows a pulse to be driven into the line 8x for the Y signal. Prior to this time, the Y signal was in the "tri-state" condition, as seen in Table IV. Then, the pulse will continue until the "BORROW" signal occurs, which then resets the enable flip-flop 56, thus returning the signal Y to the tri-state condition.

The voltage "level" of the pulses, high or low, is determined by the state of the bit C7 at CARRY time. Thus, if C7 is high (the FIFO is above being HALF-FULL), then a high voltage pulse will occur on the signal Y. If the bit C7 is low (FIFO is below being HALF-FULL), then a low voltage pulse will occur for the signal Y.

Between the CARRY signal and the BORROW signal, the signal Y is not tri-stated, since a high pulse or a low pulse is on the Y signal. Then following "BORROW" and prior to the next "CARRY", then the Y signal is tri-stated and there is no pulse available to indicate the Y signal.

Driver Block 9(E):

Referring to FIG. 5, there was seen the "difference" signal Y on line 8x, which signal can be either "tri-stated", or alternatively, will have a high or a low pulse of a variable width and period. This difference signal Y is seen to connect to the driver module 9,E, whose output then produces the signal Yo on line 9o, and which is fed to the device under control 10(D) which in this case, is the voltage controlled oscillator VCXO, 10.

Figure 10:
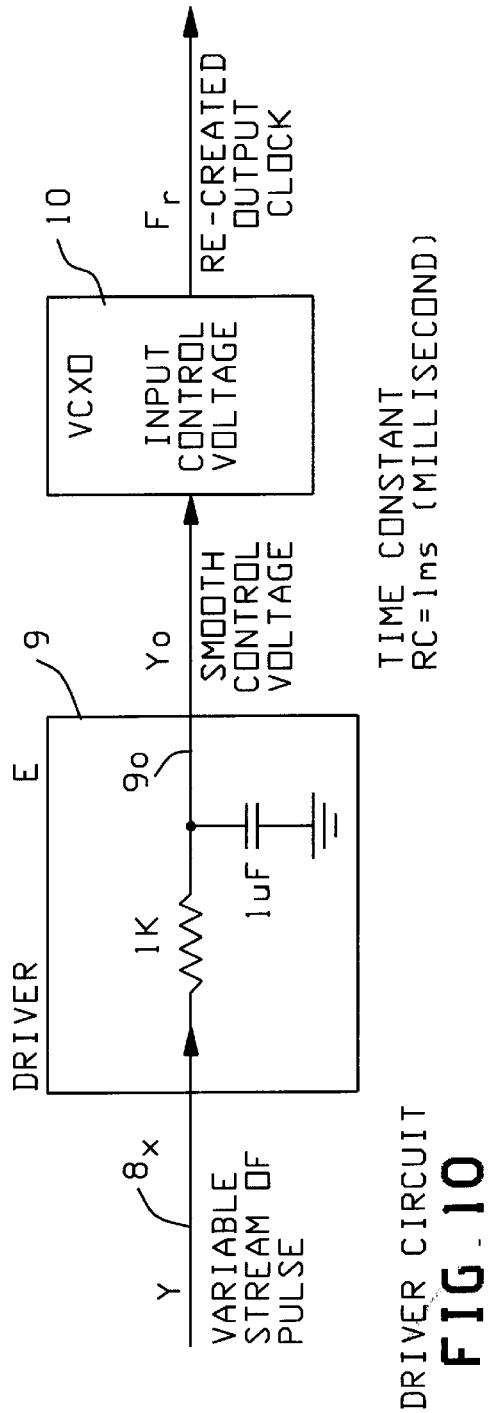
FIG. 10 is a drawing showing the elements of the driver circuit 9(E) and the target device under control, i.e. the variable frequency oscillator.

The control signal Yo is the output of the driver 9 and is the input control voltage which is fed to the voltage controlled variable oscillator 10 VCXO, which then controls the frequency output designated as $F_r$. The voltage of Yo will be a smooth and stable voltage level and will not be subject to the minor disturbances that ordinary digital logic has. The driver module 9 in the control system is external to the Field Programmable Gate Array (FPGA) where most of the control system is generally implemented. However, the driver element is trivial in terms of cost and complexity. The particular driver in this control system is a very simple "low-pass" passive filter consisting of a series resistor and capacitor as illustrated in FIG. 10.

The effect of this "driver" low-pass filter is that the input control voltage Yo on line 9o which is fed to the variable oscillator 10 VCXO, is a stable DC level (but also may be slowly changing). Small changes in the difference signal Y will have virtually no effect on the signal Yo. Thus, this creates a very stable output frequency $F_r$.

Table V which is shown below gives the range of values in the various fields which were mentioned above. It also shows the range of pulses possible for the signal Y from these values. The Table V also shows how the pulse values vary as the counts move away from the center point (HALF-FULL position). The Table V also shows that at the two extremes—EMPTY or FULL—the pulses are three microseconds wide and have a period of 3 microseconds. In other words, at the extremes, the pulses are a continuous high or a continuous low value. It may be noted that these extremes would most likely never occur except at the first turn-on and initial power-up.

TABLE V

PULSE FACTORS SUMMARY

| FIFO comment | C7 | Image Count | Xnor | Exponent | Period Count | Width Count | Period time ($\mu s$) | Width time ($\mu s$) |
|---|---|---|---|---|---|---|---|---|
| empty | 0 | 0 | 127 | 255 | 32640 | 127 | 3 | 3 |
|  | 0 | 16 | 111 | 127 | 16256 | 111 | 413 | 3 |
|  | 0 | 32 | 95 | 63 | 8064 | 95 | 618 | 2 |
|  | 0 | 48 | 79 | 31 | 3968 | 79 | 720 | 2 |
|  | 0 | 64 | 63 | 15 | 1920 | 63 | 771 | 2 |
|  | 0 | 80 | 47 | 7 | 896 | 47 | 797 | 1 |
|  | 0 | 96 | 31 | 3 | 384 | 31 | 810 | 1 |
|  | 0 | 112 | 15 | 1 | 128 | 15 | 816 | 0 |

TABLE V-continued

PULSE FACTORS SUMMARY

| FIFO comment | C7 | Image Count | Xnor | Exponent | Period Count | Width Count | Period time ($\mu s$) | Width time ($\mu s$) |
|---|---|---|---|---|---|---|---|---|
| half-full | 0 | 127 | 0 | 1 | 128 | 0 | 816 | 0 |
| half-full | 1 | 0 | 0 | 1 | 128 | 0 | 816 | 0 |
| | 1 | 16 | 16 | 3 | 384 | 16 | 810 | 0 |
| | 1 | 32 | 32 | 7 | 896 | 32 | 797 | 1 |
| | 1 | 48 | 48 | 15 | 1920 | 48 | 771 | 1 |
| | 1 | 64 | 64 | 31 | 3968 | 64 | 720 | 2 |
| | 1 | 80 | 80 | 63 | 8064 | 80 | 618 | 2 |
| | 1 | 96 | 96 | 127 | 16256 | 96 | 413 | 2 |
| | 1 | 112 | 112 | 255 | 32640 | 112 | 3 | 3 |
| full | 1 | 127 | 127 | 255 | 32640 | 127 | 3 | 3 |

(Note: times are in microseconds. Based upon 25 nanoseconds $I_f$ clock rate.) ($\mu s$ = microseconds)

The Table V also shows that in the "normal" operating condition, that is to say, near the HALF-FULL position, the pulses are very narrow (that is between 0 and 1 microseconds) and also very far apart (about 800 microseconds apart). Thus, in "normal" operating conditions, very few pulses occur and they are very narrow. Thus, the signal Y takes very little action in order to affect the signal Yo, and thus the signal Yo holds the frequency $F_r$ in a very stable fashion.

Referring to FIG. 10, it will be seen that the signal Y is a variable stream of pulses on line 8x which is fed to a 1,000 ohm resistor and 1 microfarad capacitor in the driver 9 which then provides a smooth control voltage signal Yo which feeds the variable oscillator 10, VCXO, whereupon the output of the variable oscillator provides the re-created output clock frequency $F_r$. The RC time constant for the low-pass filter in driver 9 is about 1 millisecond. As is well known, the one time constant of a RC circuit (resistor-capacitor) charges the capacitor to 63% of the total voltage, or else discharges it by 37%. From this factor and the very small duration of the pulses driving the circuit on signal Y, it is seen that the signal Y can only affect the signal Yo in very tiny increments under normal conditions. Even the larger pulses on the signal Y will only add or subtract a few millivolts from the voltage value of the signal Yo.

Near the HALF-FULL position, where the frequency $F_r$ is at the desired value, the voltage increments are much smaller and occur very infrequently. Thus, the input control voltage Yo going to the variable oscillator 10 VCXO, is very stable, and thus changes to the frequency $F_r$ will be minor and relatively stable.

Thus, only in the "extreme" positions at power-up, would there occur the changes to the input control voltage Yo which would be of significant value. Of course in these cases, a large change in the frequency $F_r$ is then required to get the frequency to its proper value near the middle range.

Described herein has been a stable and very simply-implemented control system which can be used to re-create an output clock frequency from the rate of input data delivery coming into a transport system with inserted headers. Basically, the implementation devices can be provided with standard elements. The variable oscillator is a well-known device and the FIFO module is inexpensive and well-known. The RC circuit is simple and inexpensive. All of the intelligence and control logic is implemented within a Field Programmable Array (FPGA) device. Only about 7% of the FPGA's capacity is actually used.

Another feature is that since many systems already have present a Field Programmable Gate Array device in order to provide header detection in other necessary data path operations, then the control factors for the control system are virtually added almost for free. Further, the presence of a FIFO was already necessary in the system.

Thus, by use of the simple digital control system to re-create the original data clock frequency, there is no need for an expensive on-card high precision oscillator. A system which required such a high precision oscillator device to be the output clock source, would be the only other way of handling the present control system. However, the described simple control system approach is far more cost effective, since the control system is in the Field Programmable Gate Arrays, it can be modified easily both in the debug period, and later in the field, as required. A hard, crystal oscillator circuit would not have this flexibility and would be very costly for usage to begin with.

Thus, the present system will provide a re-created output frequency $F_r$ in a simple cost-effective fashion which re-creates the input clock frequency according to the rate of input data delivery, and this is done by providing a control system implemented with basically simple programmable digital logic devices.

While other implementations of the invention may possibly be developed, it is understood that the invention is defined by the following claims.

What is claimed is:

1. A data transport system for regulating the transfer rate of incoming serial digital data and headers, received from a remote transmitter at an original clock rate, $F_o$, to a FIFO register after removal of headers comprising:

(a) means to load said incoming serial digital data without headers into a FIFO register at an incoming frequency rate of $I_f$ which was set to clock said incoming digital data and headers and wherein the frequency rate $I_f$ is the expanded rate of $F_o$ plus headers, said means to load including:

(a1) means to strip said incoming serial digital data of its header-bytes and only permit said incoming digital data to be loaded into said FIFO register;

(b) means to generate an output frequency data rate $F_r$ for said FIFO register which will continuously match the remotely transmitted original digital data clocking frequency rate $F_o$ so that said FIFO will maintain itself at a HALF-FULL status condition during normal operation.

2. In an input digital data receiving and transport system, a method for controlling a voltage controlled oscillator to re-create an output frequency $F_r$ to regulate the output data rate of a FIFO data register which receives bursts of incoming data at an incoming frequency rate of $I_f$, said method comprising the steps of:

(a) loading said FIFO register with incoming serial digital data at a frequency rate $I_f$;

(b) loading a difference generator (G,4) with said incoming serial data at the frequency rate $I_f$ and decrementing this frequency rate, $I_f$, by a first feedback signal Fri from a voltage controlled oscillator and a second feedback digital signal which represents the FIFO loading status, in order to develop a difference signal Y;

(c) feeding said difference signal Y to a driver module to develop a control signal Yo;

(d) using said control signal Yo to regulate a voltage controlled oscillator 10;

(e) utilizing the output frequency $F_r$ of said voltage controlled oscillator to control the output clocking frequency data rate of said FIFO.

3. The method of claim 2, wherein step (a) includes:

(a1) separating the header bytes of said incoming data so that said FIFO receives only the data without the headers.

4. The method of claim 3 wherein step (a) further includes:

(a2) developing a status signal from said FIFO register to indicate the FIFO loading status as FULL, HALF-FULL or EMPTY, for use as said second feedback signal to said difference generator (G).

5. The method of claim 4 wherein step (b) includes the steps of:

(b1) loading said incoming digital serial data, at the incoming clock frequency $I_f$, into a clock arbitration logic unit (40) and using said $F_r$ signal as feedback to increment or decrement a FIFO image logic unit which holds the loading status of data in said FIFO;

(b2) counting, in said image logic unit (42), to indicate, via an 8-bit pulse logic signal, whether said FIFO is transferring out the average normal rate of data or whether it is transferring data below or above its normal average rate;

(b3) developing pulse voltages, pulse rates and pulse widths to a pulse logic unit 40 which provides a corrective voltage output Y to a driver module;

(b4) transmitting, by said driver module, said corrective voltage output to said voltage controlled oscillator;

(b5) outputting the said output frequency $F_r$ for stabilizing the FIFO data transfer rate so that the incoming data rate $I_f$ is closely matched by the output frequency $F_r$.

6. The method of claim 5 wherein step (b3) includes the steps of:

(b3a) using an exponential function to develop a digital signal "EX" to a pulse period counter in said pulse logic unit where $EX=2^{(PL3+1)}-1$ and PL3 represents the upper 3 bits of the 8-bit pulse logic signal from said FIFO image logic unit (42).

7. A data transport system for regulating the transfer rate of incoming serial digital data and headers received from a remote transmitter at an original clock rate, $F_0$, to a FIFO register after removal of headers comprising:

(a) means to load said incoming serial digital data without headers into a FIFO register at an incoming frequency rate of $I_f$ which was set to clock said incoming digital data and clock said incoming digital data and headers and wherein the frequency rate $I_f$ is the expanded rate of $F_0$ plus headers;

(b) means to generate an output frequency data rate $F_r$ for said FIFO register which will continuously match the remotely transmitted original digital data clocking frequency rate $F_0$, so that said FIFO will maintain itself at a HALF-FULL status condition during normal operation, wherein said means to generate an output frequency data rate includes:

(b1) means to generate a difference signal Y which utilizes the input rate $I_f$ and is regulated by a first feedback signal $F_r$, and a second feedback signal indicating the loading status of said FIFO register;

(b2) means to feed said difference signal Y to a driver module to develop a control voltage Yo for a voltage controlled oscillator;

(b3) said voltage controlled oscillator generating an output frequency clock data rate $F_r$, which closely matches the average incoming serial data rate frequency $I_f$.

8. A data transport system for regulating the transfer rate of incoming serial digital data and headers, received from a remote transmitter at an original clock rate, $F_o$, to a FIFO register after removal of headers comprising:

(a) means to load said incoming serial digital data without headers into an FIFO register at an incoming frequency rate of $I_f$ which was set to clock said incoming digital data and headers and wherein the frequency rate $I_f$ is the expanded rate of $F_0$ plus headers;

(b) means to generate an output frequency data rate $F_R$ for said FIFO register which will continuously match the remotely transmitted original digital data clocking frequency rate $F_0$ so that said FIFO will maintain itself at a HALF-FULL status condition during normal operation, wherein said means to generate an output frequency digital data rate FR includes:

(b1) difference generator means for receiving said incoming serial data at the $I_f$ frequency rate and including:

(b1a) clock arbitration logic means for receiving said incoming serial data at the $I_f$ clock rate and for developing an incrementation/decrementation signal according to the feedback frequency signal rate $F_r$, said incrementation/decrementation signal being transmitted to a FIFO image logic unit;

(b1b) said FIFO image logic unit operating at said $I_f$ clock rate and indicating the difference between the average $I_f$ clock and the output clock frequency $F_r$, and includes:

(b1b1) an image counter which develops an 8-bit digital signal indicating the loading status of said FIFO register;

(b1c) a pulse logic unit for receiving said 8-bit FIFO loading status signal from said image counter and including:

(b1c1) means to utilize the 3 most significant bits of said 8-bit FIFO loading status signal as an exponential power of "2" in order to control a pulse period counter to said driver;

(b1c2) means to regulate a pulse width counter signal to said driver module according to the FIFO loading status signal developed by said image logic;

(b1d) said driver module for receiving the output signal Y from said pulse logic unit and including:

(b1d1) an R-C voltage stabilizing circuit to provide an output voltage Yo;

(b1e) a voltage-controlled oscillator for receiving said voltage signal Yo and generating the output frequency data clock rate $F_r$ for said FIFO register.

* * * * *